(12) United States Patent
Liu et al.

(10) Patent No.: US 11,637,183 B2
(45) Date of Patent: Apr. 25, 2023

(54) METHOD OF FORMING A SEMICONDUCTOR TRANSISTOR HAVING AN EPITAXIAL CHANNEL LAYER

(71) Applicant: United Semiconductor (Xiamen) Co., Ltd., Fujian (CN)

(72) Inventors: Sheng-Hsu Liu, Changhua County (TW); Shih-Hsien Huang, Kaohsiung (TW); Wen Yi Tan, Fujian (CN)

(73) Assignee: United Semiconductor (Xiamen) Co., Ltd.

( * ) Notice: Subject to any disclaimer, the term of this patent is extended or adjusted under 35 U.S.C. 154(b) by 0 days.

(21) Appl. No.: 17/670,521

(22) Filed: Feb. 14, 2022

(65) Prior Publication Data

US 2022/0165849 A1 May 26, 2022

Related U.S. Application Data

(62) Division of application No. 16/831,817, filed on Mar. 27, 2020, now Pat. No. 11,289,575.

(30) Foreign Application Priority Data

Feb. 4, 2020 (CN) .......................... 202010079601.1

(51) Int. Cl.
*H01L 29/10* (2006.01)
*H01L 21/762* (2006.01)
*H01L 29/66* (2006.01)
*H01L 29/161* (2006.01)

(52) U.S. Cl.
CPC .... *H01L 29/1033* (2013.01); *H01L 21/76224* (2013.01); *H01L 29/161* (2013.01); *H01L 29/66477* (2013.01)

(58) Field of Classification Search
CPC .......... H01L 29/1033; H01L 21/76224; H01L 29/161; H01L 29/66477; H01L 29/66636; H01L 29/78; H01L 29/0684; H01L 29/66409
USPC ......................................................... 257/288
See application file for complete search history.

(56) References Cited

U.S. PATENT DOCUMENTS

| 5,512,771 | A  | 4/1996  | Hiroki  |
| 6,461,937 | B1 | 10/2002 | Kim     |
| 6,498,359 | B2 | 12/2002 | Schmidt |
| 6,930,002 | B1 | 8/2005  | Chen    |
| 7,910,445 | B2 | 3/2011  | Onoda   |
| 7,932,143 | B1 | 4/2011  | Pal     |

(Continued)

FOREIGN PATENT DOCUMENTS

| CN | 1227969 A | 9/1999 |
| CN | 1630095 A | 6/2005 |

(Continued)

*Primary Examiner* — Mohammad M Hoque
(74) *Attorney, Agent, or Firm* — Winston Hsu

(57) ABSTRACT

A method for fabricating a semiconductor transistor is disclosed. A substrate of a first conductivity type is provided. An ion well of a second conductivity type is formed in the substrate. An epitaxial channel layer of the first conductivity type is grown from the main surface of the substrate. A gate dielectric layer is formed on the epitaxial channel layer. A gate is formed on the gate dielectric layer. A source region and a drain region are then formed in the substrate. The source region and the drain region have the first conductivity type.

7 Claims, 6 Drawing Sheets

(56) References Cited

U.S. PATENT DOCUMENTS

| | | |
|---|---|---|
| 7,964,910 B2 | 6/2011 | Dyer |
| 8,455,859 B2 | 6/2013 | Tsai |
| 2002/0038896 A1 | 4/2002 | Arai |
| 2002/0052075 A1* | 5/2002 | Noda ............. H01L 21/823807 438/224 |
| 2002/0089003 A1 | 7/2002 | Lee |
| 2005/0110071 A1 | 5/2005 | Ema |
| 2005/0161719 A1 | 7/2005 | Kondo |
| 2006/0138398 A1 | 6/2006 | Shimamune |
| 2008/0230845 A1 | 9/2008 | Okonogi |
| 2009/0283842 A1 | 11/2009 | Hokazono |
| 2011/0121397 A1* | 5/2011 | Pal .................... H01L 21/28123 257/E29.264 |
| 2012/0115298 A1 | 5/2012 | Kim |
| 2013/0119469 A1 | 5/2013 | Iwamatsu |
| 2013/0280897 A1 | 10/2013 | Tamura |
| 2014/0264501 A1 | 9/2014 | Na |
| 2015/0171168 A1 | 6/2015 | Ishida |
| 2016/0013092 A1 | 1/2016 | Aika |
| 2020/0152784 A1 | 5/2020 | Chern |
| 2021/0083129 A1 | 3/2021 | Liu |

FOREIGN PATENT DOCUMENTS

| | | |
|---|---|---|
| CN | 1819202 A | 8/2006 |
| CN | 104752227 A | 7/2015 |

\* cited by examiner

METHOD OF FORMING A SEMICONDUCTOR TRANSISTOR HAVING AN EPITAXIAL CHANNEL LAYER

CROSS REFERENCE TO RELATED APPLICATIONS

This application is a division of U.S. application Ser. No. 16/831,817, filed on Mar. 27, 2020. The content of the application is incorporated herein by reference.

BACKGROUND OF THE INVENTION

1. Field of the Invention

The present invention relates to the field of semiconductor technology, and in particular, to an improved semiconductor transistor and a method for manufacturing the same.

2. Description of the Prior Art

As known in the art, a MOSFET device includes a pair of source/drain regions formed on a surface of a silicon substrate, a gate oxide film formed on the substrate between the source/drain regions, and a gate electrode formed on the surface of the gate oxide film. The surface area of the substrate between the source region and the drain region is defined as a channel region. The length of the channel region is the distance between the source/drain regions, which is typically somewhat shorter than the gate length.

In order to increase the speed of the MOS device, there exists a continuing trend of scaling-down the structure to smaller sizes. One of the ways of scaling is by reducing the length of the gate. However, one of the most pronounced effects occurs due to the gate length reduction is the loss of gate electrode control which is sometimes referred to as threshold ($V_T$) roll-off. The threshold voltage $V_T$ for the MOSFET device is defined to be the gate-to-source voltage $V_{gs}$ applied across the gate and source electrodes, below which the MOS device drain-to-source current $I_{ds}$ becomes near zero.

There is known in the prior art a technique for controlling the threshold distribution by threshold adjust implant (channel doping at the silicon-insulation interface) prior to the deposition of the gate polysilicon. However, due to the diffusion of the implanted dopants with the above-mentioned threshold adjustment ion implantation process, a Gauss function distribution is formed near the surface of the silicon substrate, and it is difficult to achieve a uniform dopant concentration distribution. Therefore, the prior art cannot effectively control the instability phenomenon of the minimum voltage (Vmin) of the device caused by the leakage of the device.

SUMMARY OF THE INVENTION

One object of the present invention is to provide an improved semiconductor transistor and a manufacturing method thereof, which can solve the above-mentioned shortcomings and disadvantages of the prior art.

One aspect of the invention provides a semiconductor transistor including a substrate of a first conductivity type, wherein the substrate has a main surface; an ion well of a second conductivity type disposed in the substrate; a source region and a drain region spaced apart from the source region disposed within the ion well, wherein the source region and the drain region have the first conductivity type; an epitaxial channel layer of the first conductivity type grown from the main surface of the substrate and disposed between the source region and the drain region; a gate disposed on the epitaxial channel layer; and a gate dielectric layer disposed between gate and the epitaxial channel layer.

According to some embodiments, the semiconductor transistor further includes a shallow trench isolation (STI) region isolating an active area (AA) region, wherein the ion well, the source region and the drain region are disposed within the AA region.

According to some embodiments, the STI region comprises a trench-fill layer, and wherein an upper portion of the trench-fill layer protrudes from the main surface of the substrate.

According to some embodiments, the epitaxial channel layer has a facet edge adjacent to the upper portion of the trench-fill layer.

According to some embodiments, the range of an angle between the facet edge and a sidewall of the upper portion of the trench-fill layer is between 0°~45°.

According to some embodiments, the first conductivity type is P type and the second conductivity type is N type.

According to some embodiments, the epitaxial channel layer comprises P type doped silicon or P type doped silicon germanium.

According to some embodiments, the epitaxial channel layer has a P type dopant concentration range between 1E18~1E20 atoms/cm$^3$.

According to some embodiments, the P type doped silicon germanium has a germanium concentration range between 25 at. %~50 at. %.

According to some embodiments, the epitaxial channel layer has a thickness range between 5 nm and 50 nm.

Another aspect of the invention provides a method for fabricating a semiconductor transistor including: providing a substrate of a first conductivity type, wherein the substrate has a main surface; forming an ion well of a second conductivity type in the substrate; growing an epitaxial channel layer of the first conductivity type from the main surface of the substrate; forming a gate dielectric layer on the epitaxial channel layer; forming a gate on the gate dielectric layer; and forming a source region and a drain region in the substrate, wherein the source region and the drain region have the first conductivity type.

According to some embodiments, the method according further includes: forming a shallow trench isolation (STI) region in the substrate, the STI region isolating an active area (AA) region, wherein the ion well, the source region and the drain region are disposed within the AA region.

According to some embodiments, the STI region comprises a trench-fill layer, and wherein an upper portion of the trench-fill layer protrudes from the main surface of the substrate.

According to some embodiments, the epitaxial channel layer has a facet edge adjacent to the upper portion of the trench-fill layer.

According to some embodiments, the range of an angle between the facet edge and a sidewall of the upper portion of the trench-fill layer is between 0°~45°.

According to some embodiments, the first conductivity type is P type and the second conductivity type is N type.

According to some embodiments, the epitaxial channel layer comprises P type doped silicon or P type doped silicon germanium.

According to some embodiments, the epitaxial channel layer has a P type dopant concentration range between 1E18~1E20 atoms/cm$^3$.

According to some embodiments, the P type doped silicon germanium has a germanium concentration range between 25 at. %~50 at. %.

According to some embodiments, the epitaxial channel layer has a thickness range between 5 nm and 50 nm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic diagrams showing a method for fabricating a semiconductor transistor according to an embodiment of the present invention, wherein:

FIG. 1 and FIG. 7 illustrate partial layout diagrams of transistor devices;

FIGS. 2 to 6 and FIG. 9 are schematic cross-sectional views taken along the line I-I' (Y-axis direction) in FIG. 1; and FIG. 8 is a schematic cross-sectional view taken along the line II-II' (X-axis direction) in FIG. 7.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
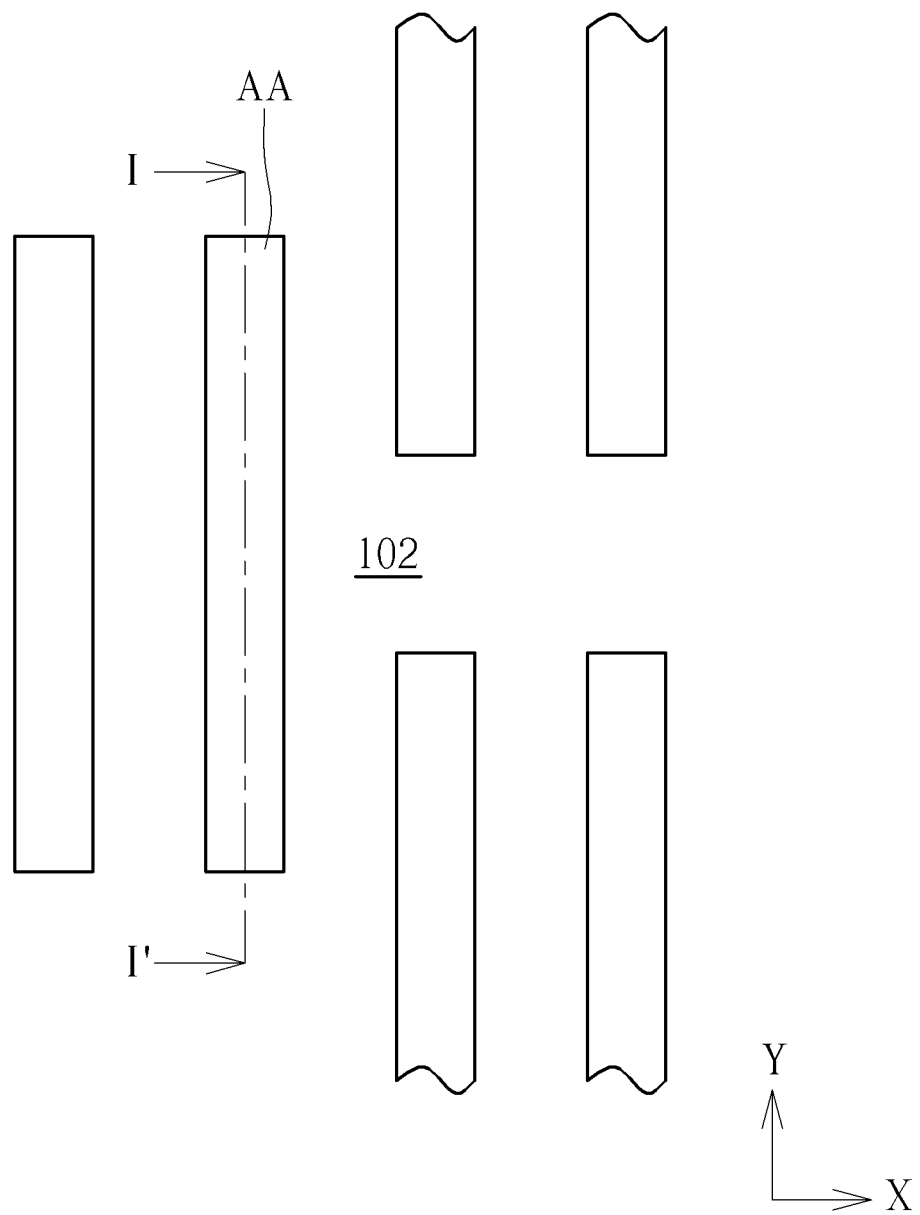
Figure 5:
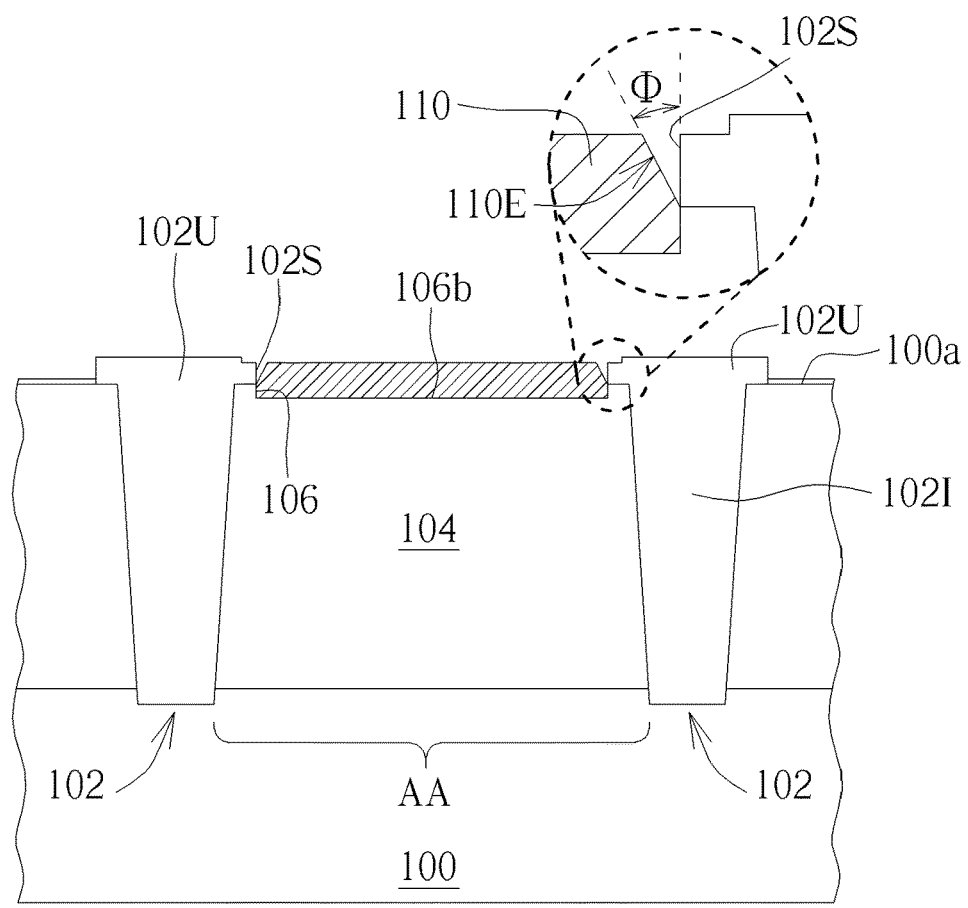
Figure 6:
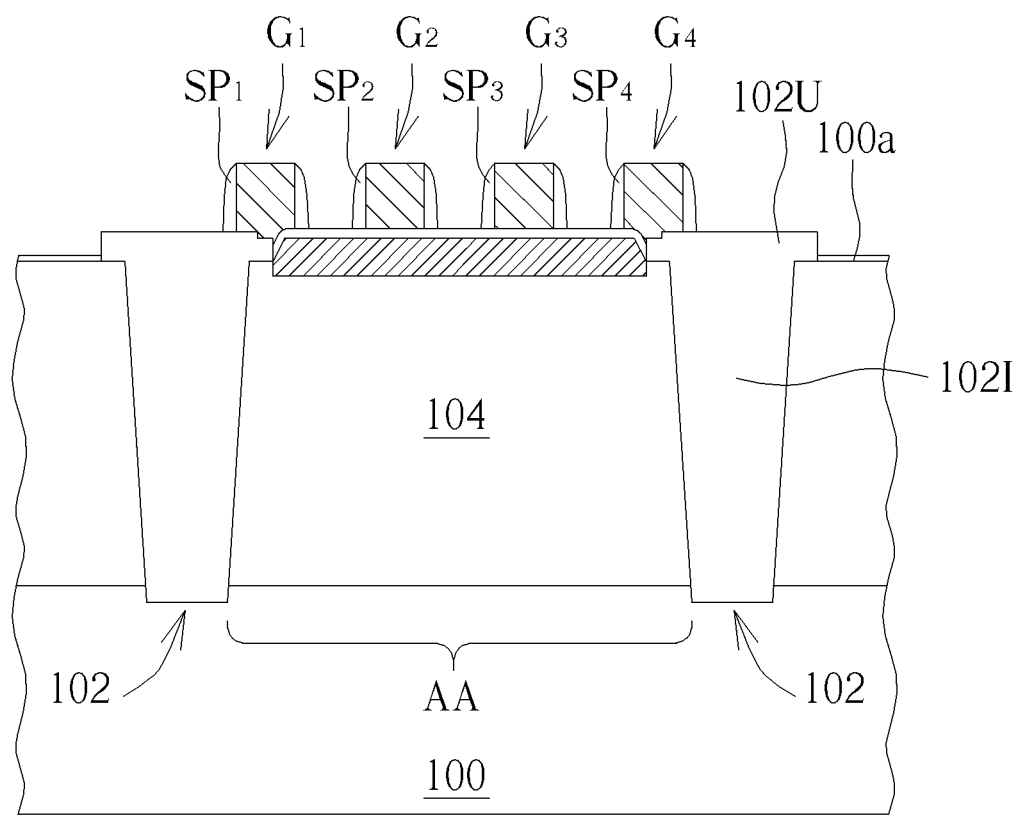
Figure 7:
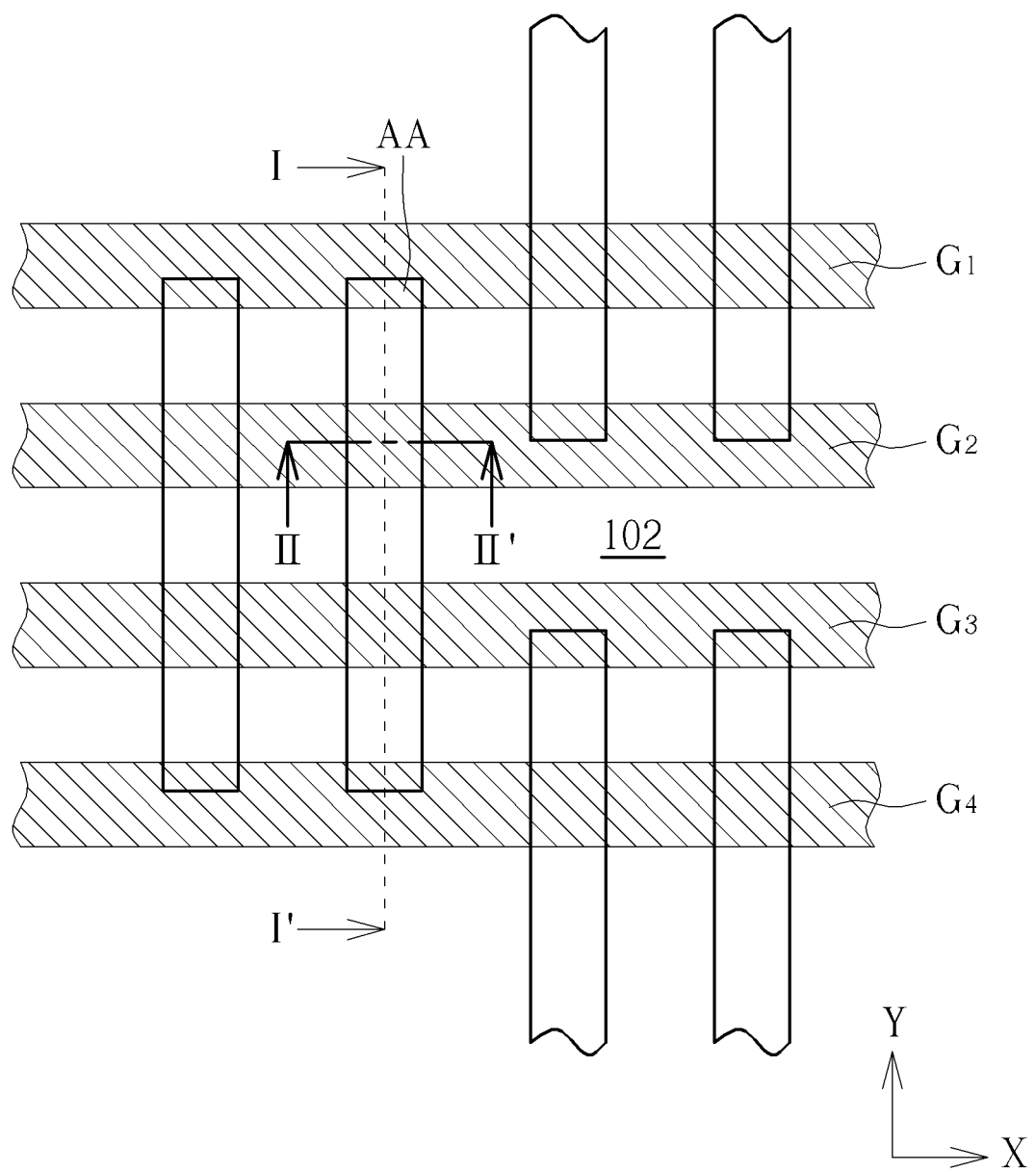
Figure 8:
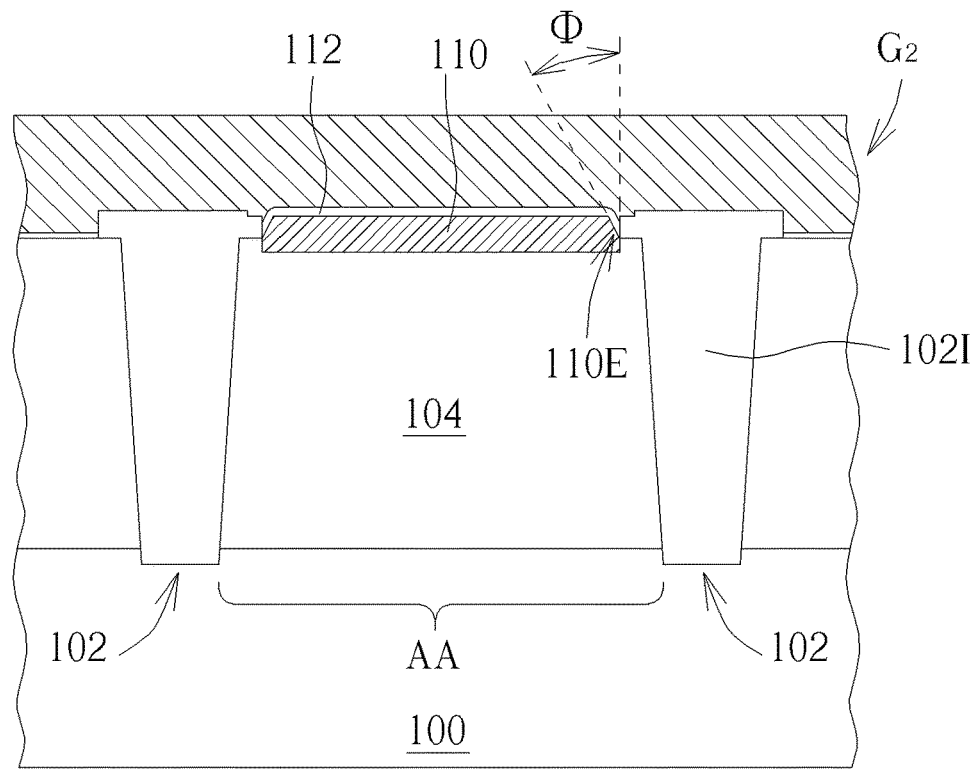

Please refer to FIG. 1 to FIG. 9, which are schematic diagrams of a method for fabricating a semiconductor transistor according to an embodiment of the present invention, wherein FIG. 1 and FIG. 7 illustrate partial layout diagrams of transistor devices, and FIGS. 2 to 6 and FIG. 9 are schematic cross-sectional views taken along the line I-I' (Y-axis direction) in FIG. 1, and FIG. 8 is a schematic cross-sectional view taken along the line II-II' (X-axis direction) in FIG. 7. Although a PMOS device is taken as an example in the drawings to describe a method for fabricating a semiconductor transistor, those skilled in the art should understand that the present invention can also be applied to the fabrication of an NMOS transistor.

Figure 2:
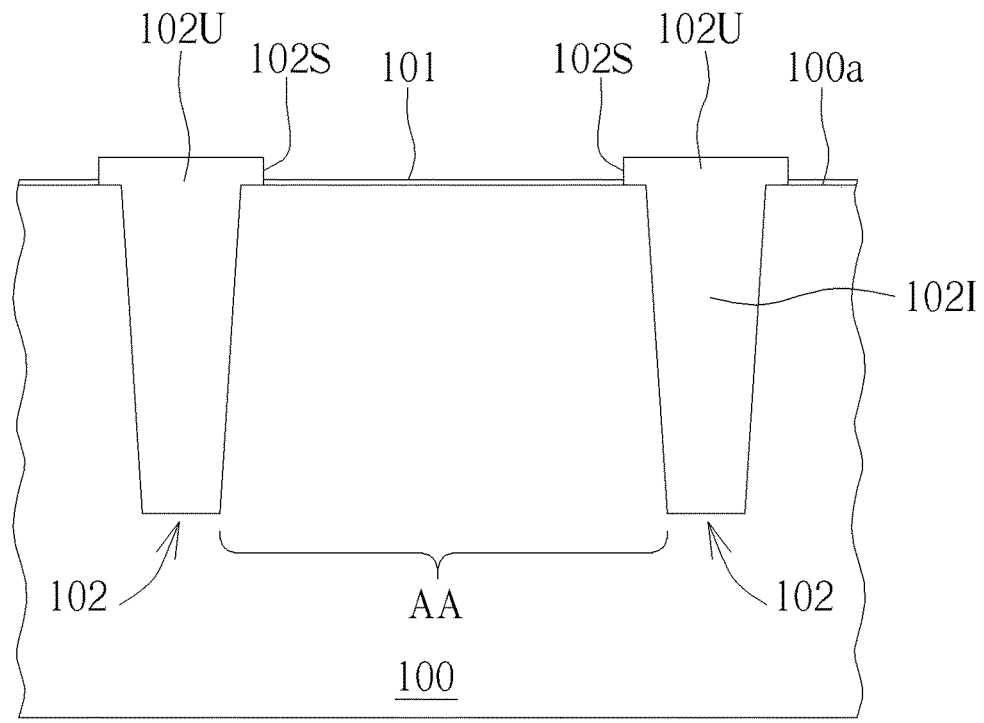

As shown in FIG. 1 and FIG. 2, a substrate 100 is first provided and has a first conductivity type, for example, P type. The substrate 100 may be a semiconductor substrate, for example, a silicon substrate, but is not limited thereto. The substrate 100 has a main surface 100a. Next, a shallow trench isolation (STI) region 102 is formed in the substrate 100 to isolate the active region AA. The STI region 102 includes a trench-fill layer 102I. The trench-fill layer 102I has an upper portion 102U protruding from the main surface 100a of the substrate 100. According to the embodiment of the present invention, the sidewall 102S of the upper portion 102U is approximately perpendicular to the main surface 100a. According to the embodiment of the present invention, there may be an oxide layer 101 on the active area AA.

Figure 3:
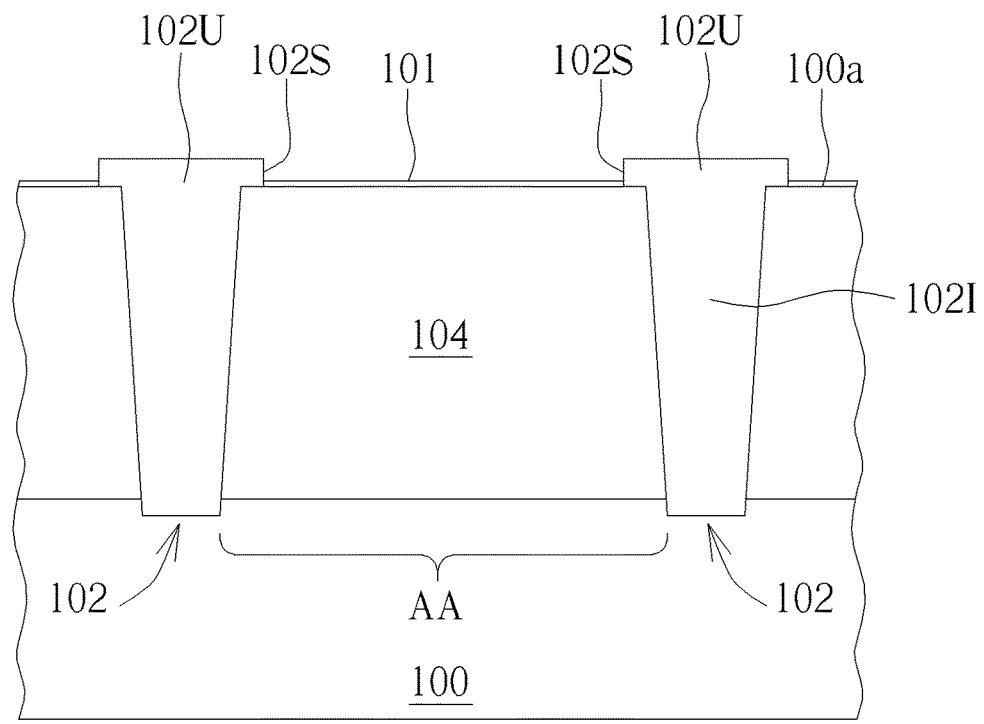

As shown in FIG. 3, an ion well 104 is formed in the substrate 100. According to an embodiment of the present invention, the ion well 104 may have a second conductivity type, for example, N type. According to the embodiment of the present invention, the ion well 104 may be formed by a lithography process and an ion implantation process.

Figure 4:
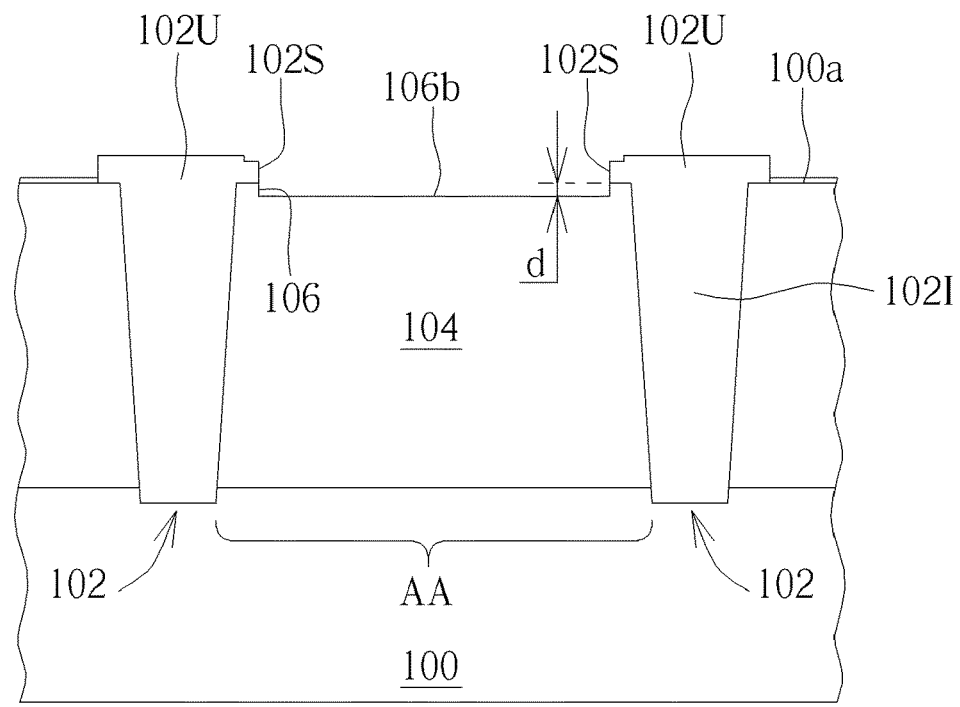

As shown in FIG. 4, an etching process can be selectively performed to etch away the oxide layer 101 and a part of the substrate 100 on the active area AA to form a recessed area 106. The depth d of the bottom 106b of the recessed area 106 is approximately between 0 and 500 angstroms, but not limited to this. In other embodiments, only the oxide layer 101 on the active area AA may be removed, while the recessed area 106 is not formed.

Next, as shown in FIG. 5, a cleaning process and an epitaxial growth process are performed. An epitaxial channel layer 110 is grown from the bottom 106b of the recessed area 106. According to an embodiment of the present invention, the epitaxial channel layer 110 has a first conductivity type, for example, P type. According to an embodiment of the present invention, the epitaxial channel layer 110 may include P-doped silicon or P-doped silicon germanium, wherein the P-doped silicon germanium may be represented by $Si_{(1-x)}Ge_x$, wherein x=0.25~0.5.

According to the embodiment of the present invention, the concentration of the P-type dopant in the epitaxial channel layer 110 may be between 1E18~1E20 atoms/cm$^3$. According to the embodiment of the present invention, the germanium concentration of the P-type doped silicon germanium is between 25 at. %~50 at. %. According to an embodiment of the present invention, the thickness of the epitaxial channel layer 110 is between 5 nm and 50 nm.

According to the embodiment of the present invention, as shown in the enlarged view on the right side of FIG. 5, the epitaxial channel layer 110 has a facet edge 110E adjacent to the upper portion 102U of the trench filling layer 102I. According to the embodiment of the present invention, the facet edge 110E is an inclined surface that is not parallel to the main surface 100a of the substrate 100. According to the embodiment of the present invention, the included angle Φ between the facet edge 110E and the sidewall 102S of the upper portion 102U of the trench-fill layer 102 may be between 0° and 45°.

Next, as shown in FIG. 6, a gate dielectric layer 112, such as a silicon dioxide layer, is formed on the epitaxial channel layer 110. According to the embodiment of the present invention, the gate dielectric layer 112 may be formed by a thermal oxidation method, but is not limited thereto. Next, gates G1 to G4 are formed on the gate dielectric layer 112. According to the embodiment of the present invention, the gates G1 to G4 may be polycrystalline silicon (polysilicon) gates, but are not limited thereto. According to the embodiment of the present invention, spacers SP1 to SP4 may be formed on the sidewalls of the gate electrodes G1 to G4, respectively. Please also refer to FIG. 7, which shows the relative positions of the gate electrodes G1 to G4 and the active area AA. According to the embodiment of the present invention, the gate G1 and the gate G4 pass through both ends of the active area AA, respectively.

Please also refer to FIG. 8, which is a schematic cross-sectional view taken along line II-II' (X-axis direction) in FIG. 7. As shown in FIG. 8, in this direction (that is, the gate length direction), it can also be seen that the epitaxial channel layer 110 has the same facet edge 110E adjacent to the upper portion 102U of the trench-fill layer 102I.

Figure 9:
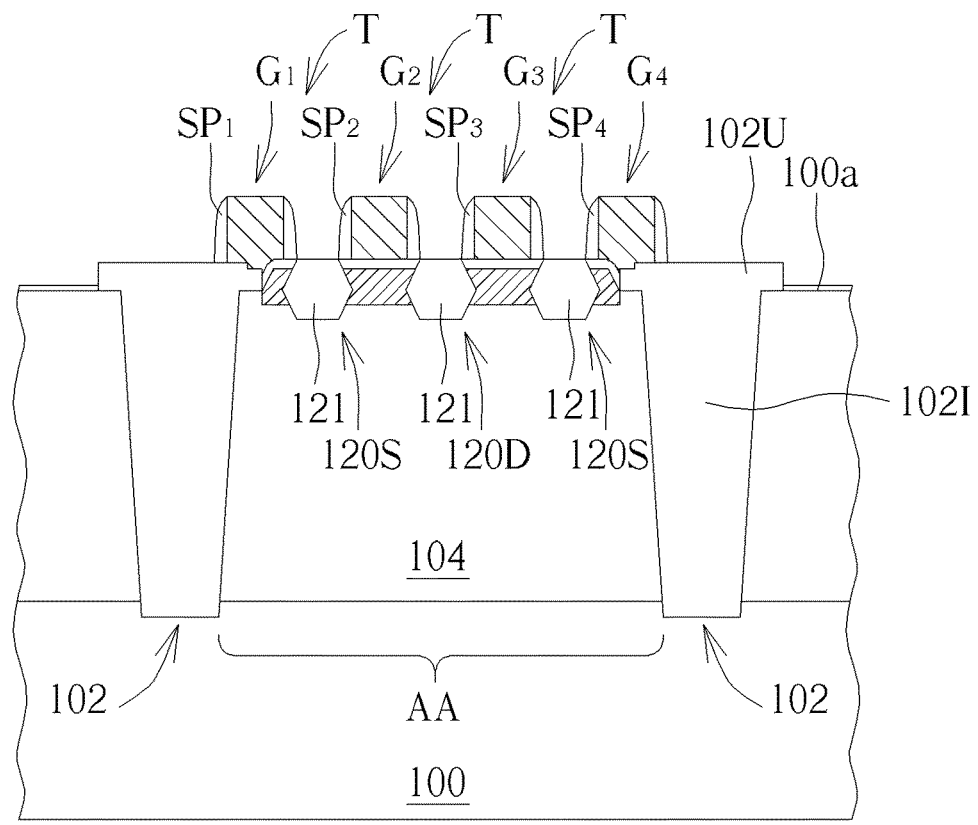

Next, as shown in FIG. 9, a source region 120S and a drain region 120D are formed in the active region AA of the substrate 100. According to an embodiment of the present invention, the source region 120S and the drain region 120D may have a first conductivity type, for example, P type. For example, the method for forming the source region 120S and the drain region 120D may include etching a trench in the active region AA of the substrate 100, and then growing a silicon germanium layer 121 in a selective epitaxial growth process. The method for forming the source region 120S and the drain region 120D described above is a well-known technique, so details thereof will not be repeated.

According to the embodiment of the present invention, the epitaxial channel layer 110 is located below the gate G2 and the gate G3 between the source region 120S and the drain region 120D to form a channel region of the semiconductor transistor T. In addition, the epitaxial channel layer 110 may directly contact the silicon germanium layer 121 in the source region 120S and the drain region 120D.

The invention has the advantage that the epitaxial channel layer 110 is used to replace the threshold adjustment ion implantation process in the prior art. Since the epitaxial channel layer 110 can have a uniform dopant concentration, it can solve the problem that the prior art cannot effectively control the unstable minimum voltage (Vmin) of the device caused by the device leakage. In addition, the present invention can also improve the carrier mobility in the channel region.

As can be seen from FIG. 8 and FIG. 9, in structure, the semiconductor transistor T of the present invention includes a substrate 100 and has a first conductivity type (for example, P type), wherein the substrate 100 has a main surface 100a. An ion well 104 is provided in the substrate 100 and has a second conductivity type (for example, N type). A source region 120S and a drain region 120D separated from each other are provided in the ion well 104, and the source region 120S and the drain region 120D have the first conductivity type (for example, P-type).

The semiconductor transistor T of the present invention further includes an epitaxial channel layer 110 having a first conductivity type (for example, P-type), which is grown from the main surface 100a of the substrate 100 or from the bottom 106b of the recessed area 106. According to an embodiment of the present invention, the thickness of the epitaxial channel layer 110 is between 5 nm and 50 nm. The epitaxial channel layer 110 is located between the source region 120S and the drain region 120D. Gate electrodes G2 and G3 are provided on the epitaxial channel layer 110. A gate dielectric layer 112 is provided between the gates G2 and G3 and the epitaxial channel layer 110.

According to the embodiment of the present invention, the semiconductor transistor T further includes a STI region 102 to isolate the active region AA. The ion well 104, the source region 120S, and the drain region 120D are located in the active region AA. According to the embodiment of the present invention, the STI region 102 includes a trench-fill layer 102I, wherein an upper portion 102U of the trench-fill layer 102I protrudes from the main surface 100a of the substrate 100.

According to an embodiment of the present invention, the epitaxial channel layer 110 may have a facet edge 110E adjacent to the upper portion 102U of the trench-fill layer 102I. According to the embodiment of the present invention, the included angle Φ between the facet edge 110E and the sidewall 102S of the upper portion 102U of the trench-fill layer 102I is between 0° and 45°.

According to the embodiment of the present invention, the epitaxial channel layer 110 may include P-type doped silicon or P-type doped silicon germanium, but is not limited thereto. According to the embodiment of the present invention, for example, the concentration of the P-type dopant of the epitaxial channel layer 110 may be between 1E18~1E20 atoms/cm$^3$. According to the embodiment of the present invention, taking P-type doped germanium silicide as an example, the germanium concentration may be between 25 at. % and 50 at. %.

For example, taking an NMOS transistor as an example, the epitaxial channel layer 110 may include a boron-doped silicon layer (Si: B), a boron-doped silicon carbide layer (SiC: B), a carbon-doped gallium arsenide layer (GaAs: C) or magnesium-doped gallium nitride layer (GaN: Mg). Taking boron-doped silicon carbide layer (SiC: B) as an example, the carbon concentration may be between 3 at. %~15 at. %.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor transistor, comprising:
    providing a substrate of a first conductivity type, wherein the substrate has a main surface;
    forming a shallow trench isolation (STI) region in the substrate to isolate an active area (AA) region, wherein the STI region comprises a trench-fill layer, and wherein an upper portion of the trench-fill layer protrudes from the main surface of the substrate;
    forming an ion well of a second conductivity type in the substrate;
    growing an epitaxial channel layer of the first conductivity type from the main surface of the substrate, wherein the epitaxial channel layer has a facet edge directly facing and in direct contact with the upper portion of the trench-fill layer, and wherein a recess is formed between the facet edge and the upper portion of the trench-fill layer;
    forming a gate dielectric layer on the epitaxial channel layer;
    forming a gate on the gate dielectric layer; and
    forming a source region and a drain region in the AA region, wherein the source region and the drain region have the first conductivity type.

2. The method according to claim 1, wherein the range of an angle between the facet edge and a sidewall of the upper portion of the trench-fill layer is between 0°~45°.

3. The method according to claim 1, wherein the first conductivity type is P type and the second conductivity type is N type.

4. The method according to claim 1, wherein the epitaxial channel layer comprises P type doped silicon or P type doped silicon germanium.

5. The method according to claim 4, wherein the epitaxial channel layer has a P type dopant concentration range between 1E18~1E20 atoms/cm$^3$.

6. The semiconductor transistor according to claim 4, wherein the P type doped silicon germanium has a germanium concentration range between 25 at. %~50 at. %.

7. The method according to claim 1, wherein the epitaxial channel layer has a thickness range between 5 nm and 50 nm.

* * * * *